United States Patent
Fujimura et al.

(10) Patent No.: US 7,640,951 B2
(45) Date of Patent: Jan. 5, 2010

(54) GLASS CLOTH AND FILM SUBSTRATE USING THE SAME

(75) Inventors: Yoshinobu Fujimura, Kumiyama (JP); Yasuyuki Kimura, Otsu (JP)

(73) Assignee: Asahi-Schwebel Co., Ltd., Osaka (JP)

( * ) Notice: Subject to any disclaimer, the term of this patent is extended or adjusted under 35 U.S.C. 154(b) by 0 days.

(21) Appl. No.: 12/081,137

(22) Filed: Apr. 10, 2008

(65) Prior Publication Data

US 2008/0271806 A1    Nov. 6, 2008

Related U.S. Application Data

(62) Division of application No. 10/528,434, filed as application No. PCT/JP03/11921 on Sep. 18, 2003, now abandoned.

(30) Foreign Application Priority Data

Sep. 20, 2002 (JP) ............................. 2002-275091

(51) Int. Cl.
    *D03D 15/00* (2006.01)
    *D03D 25/00* (2006.01)
(52) U.S. Cl. .............. 139/420 R; 139/426 R; 139/420 C; 139/383 R
(58) Field of Classification Search ............. 139/383 R, 139/420 R, 426 R, 420 C
    See application file for complete search history.

(56) References Cited

U.S. PATENT DOCUMENTS

| 1,743,722 | A | * | 1/1930 | Meyer ........................... 57/258 |
| 1,991,366 | A | * | 2/1935 | Barrell ........................ 139/410 |
| 2,168,928 | A | * | 8/1939 | Barrell .................... 139/383 A |
| 2,937,668 | A | * | 5/1960 | Carey, Jr. et al. ......... 139/426 R |
| 3,571,871 | A |   | 3/1971 | Caroselli et al. |
| 3,948,702 | A |   | 4/1976 | Theissen |
| 4,090,002 | A |   | 5/1978 | Rosenblum |
| 4,707,565 | A |   | 11/1987 | Kasai et al. |
| 4,911,969 | A |   | 3/1990 | Ogata et al. |
| 5,100,722 | A |   | 3/1992 | Nakamura et al. |
| 5,217,796 | A |   | 6/1993 | Kasai et al. |
| 5,236,777 | A |   | 8/1993 | Inoguchi et al. |
| 5,447,785 | A | * | 9/1995 | Kishi et al. .................. 442/60 |

(Continued)

FOREIGN PATENT DOCUMENTS

EP    0 985 756 A1    3/2000

(Continued)

OTHER PUBLICATIONS

WO 0060153 (only derwent, Oct. 2000, WIPO, Fujimura.*

*Primary Examiner*—Bobby H Muromoto, Jr.
(74) *Attorney, Agent, or Firm*—Finnegan, Henderson, Farabow, Garrett & Dunner, L.L.P.

(57) ABSTRACT

Glass cloth which is formed of a warp yarn and a weft yarn of the same glass yarn, wherein a ratio of warp yarn width to weft yarn width is not less than 0.80 and not more than 1.20 and a ratio of an elongation rate in a length direction when a load in a range of 25 N to 100 N per 25 mm width of the glass cloth is added in a warp yarn direction, to an elongation rate in a width direction when said load is added in a weft yarn direction is not less than 0.80 and not more than 1.20.

3 Claims, 1 Drawing Sheet

PRIOR ART

U.S. PATENT DOCUMENTS

| | | | |
|---|---|---|---|
| 5,662,990 A | 9/1997 | Scari et al. | |
| 5,806,155 A | 9/1998 | Malaney et al. | |
| 7,049,253 B1 * | 5/2006 | Kimura et al. | 442/195 |
| 2006/0035552 A1 * | 2/2006 | Fujimura et al. | 442/208 |
| 2007/0190879 A1 * | 8/2007 | Gondoh et al. | 442/181 |

FOREIGN PATENT DOCUMENTS

| | | |
|---|---|---|
| EP | 1 176 239 A1 | 1/2002 |
| JP | 5-286055 | 11/1993 |
| JP | 7-226571 | 8/1995 |
| JP | 8-18179 | 1/1996 |
| JP | 11-107111 | 4/1999 |
| JP | 11-114956 | 4/1999 |
| JP | 11-507995 | 7/1999 |
| JP | 11241251 | 9/1999 |
| JP | 11-315446 | 11/1999 |
| JP | 2001-55642 | 2/2001 |
| JP | 2001-329449 | 11/2001 |
| JP | 2002-38367 | 2/2002 |
| JP | 2002-242047 | 8/2002 |
| JP | 2003-13338 | 1/2003 |
| WO | WO 96/41046 | 12/1996 |

* cited by examiner

PRIOR ART

GLASS CLOTH AND FILM SUBSTRATE USING THE SAME

This application is a divisional of U.S. application Ser. No. 10/528,434 filed Mar. 18, 2005 now abandoned, which is a §371 of International application No. PCT/JP2003/011921 filed Sep. 18, 2003, which claims priority of Japanese application No. 2002-275091, filed Sep. 20, 2002, the contents of all of which are incorporated herein by reference.

TECHNICAL FIELD

The present invention relates to glass cloth for use in a printed circuit board in the electronics/electric field and also relates to a film substrate using the glass cloth as a flexible substrate.

BACKGROUND ART

Recent applications of glass cloth used in a printed circuit board have widened to the development of package applications. Many packages have a square shaped XY plane and a substrate called an interposer used in this package is required to have no anisotropy in the XY directions.

For these packages, generally, a polyimide film based substrate or a substrate impregnated with a matrix resin and glass cloth as a reinforcing material is used. In view of the requirements for such an application, such as high rigidity, high dimensional stability, low thermal expansion, and the like, the use of a film substrate using glass cloth has been increasing. However, anisotropy in the XY directions of the film substrate, expressed by structural differences between the warp yarn direction and the weft yarn direction derived from the glass cloth, has now become a problem. At the same time, because of a requirement for a thinner package, a thinner interposer itself is needed and thus the thickness of the glass cloth used is required to be as thin as 50 μm to 20 μm.

For such a thin glass cloth, those with a reduced clearance rate by narrowing yarn distance by a fiber-opening treatment have been proposed in JP-A-5-286055, JP-A-8-18179, JP-A-11-114956 and JP-A-2002-38367.

However, the invention described in JP-A-5-286055 aims at the suppression of the dimensional change rate in a multi-layer plate molding and in the Examples thereof, a multilayered plate composed of a 6 layered prepreg is described, but there is no description of a one-layer film substrate.

Also the invention described in JP-A-8-18179 aims at the improvement of the heat resistance in soldering and there is no description on the effects of anisotropy in the XY directions.

The invention described in JP-A-11-114956 also aims at the prevention of pore generation in a resin during prepreg preparation and there is no description on the effects of anisotropy in the XY directions.

Furthermore, in the invention described in JP-A-2002-38367, there is a description that suggests a reduction of anisotropy in the XY directions by increasing the opening rate in the XY directions. However, sufficient reduction of anisotropy in the XY directions could not be attained, as shown by the difference between the opening rate of the warp yarn and the opening rate of the weft yarn in the Examples described in Table 1 or 4. As is also clear from the description on the dimensional change rate between the width and the length directions in the Examples described in Table 1 or Table 2, there is no description of a one-layered film substrate, although a multi-layered plate composed of a 4 layered prepreg is described.

DISCLOSURE OF THE INVENTION

It is an object of the present invention to provide glass cloth for use in a thin printed circuit board that is superior in isotropy, dimensional stability and mechanical characteristics and a film substrate using said glass cloth.

The present inventors have extensively studied a way to solve the above-described problems and found that anisotropy in the XY directions of a film substrate using said glass cloth is dramatically improved by making the warp yarn and the weft yarn of the glass cloth of the same glass yarn and by making the cross-sectional shape and the waviness of said warp yarn and weft yarn the same. They also found that a film substrate using said glass cloth has superior isotropy and is thin, similar to a film composed of a resin only, by optimization of the average diameter and the number of filaments forming the yarn used, and have thus completed the present invention.

That is the present invention includes the following aspects.

1. Glass cloth which is composed of a warp yarn and a weft yarn of the same glass yarn, wherein a ratio of warp yarn width to weft yarn width is not less than 0.80 and not more than 1.20 and a ratio of an elongation rate in a length direction when a load in a range of 25 N to 100 N per 25 mm width of the glass cloth is added in a warp yarn direction, to an elongation rate in a width direction when said load is added in a waft yarn direction is not less than 0.80 and not more than 1.20.

2. Glass cloth according to the above aspect 1, which is obtained by a flattening processing under a tension exerted on the glass cloth of not more than 49 N/m per 1 m width of the glass cloth.

3. Glass cloth according to the above aspect 1 or 2, wherein a thickness of the glass cloth is not less than 10 μm and not more than 50 μm.

4. Glass cloth according to any one of the above aspects 1 to 3, wherein an average diameter of filaments of the glass yarn forming the glass cloth is not less than 3.0 μm and less than 6.0 μm and the number of filaments of the glass yarn is not less than 50 and not more than 204.

5. A film substrate composed of one sheet of glass cloth according to any one of the above aspects 1 to 4 and a matrix resin.

BEST MODE FOR CARRYING OUT THE INVENTION

Figure 1:
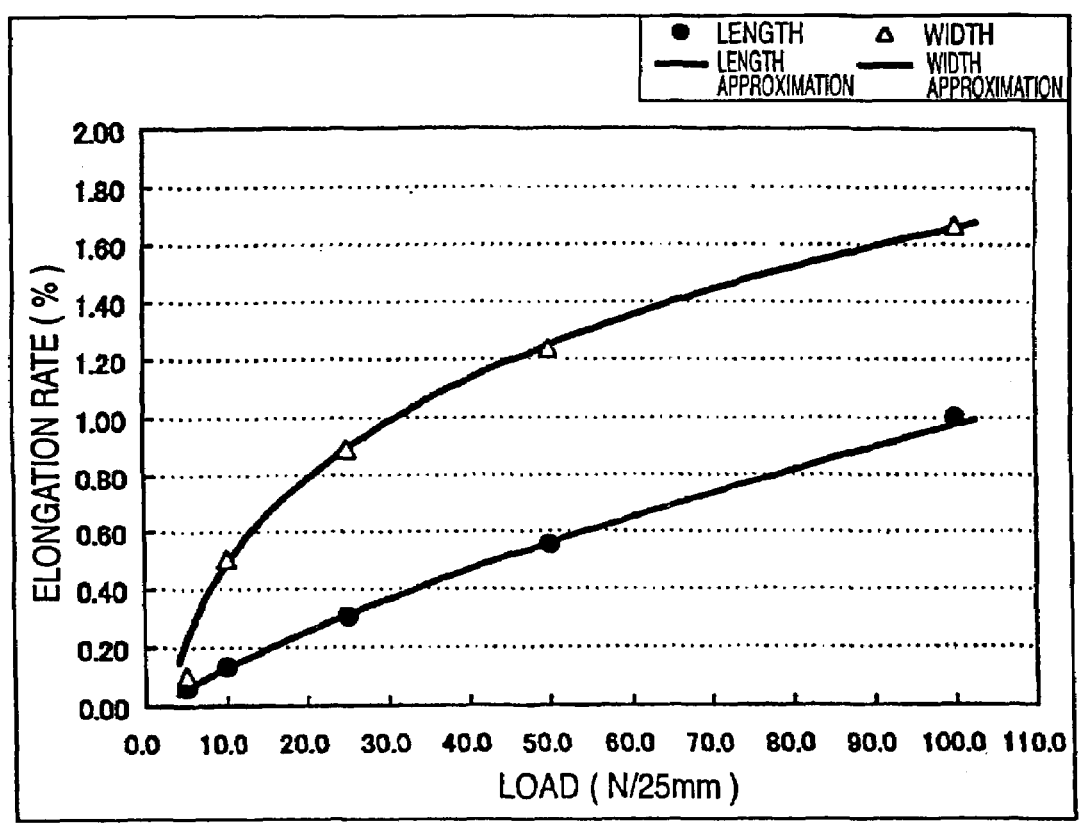
FIG. 1 is a graph showing measurement results of an elongation ratio under load in a width direction and an elongation ratio in a length direction of 2116 type glass cloth as an example of a glass cloth woven by conventional technology.

In general, glass cloth is produced under tension in the length direction as a long object. Therefore, even if it is woven by using the same glass yarn as the warp yarn and the weft yarn, the cross-sectional shape of the warp yarn and the weft yarn are generally different and their waviness state is also different. The term "the same glass yarn" means in this context, yarn having the same kind of glass such as E-glass, the same average diameter and the same number of filaments forming a strand, and the same number of strands forming the yarn. Generally, the waviness of a warp yarn under a tension load tends to be less than the waviness of a weft yarn. However, when a high density is required so that the clearance between adjacent warp yarns is substantially zero, the waviness of the warp yarn may be larger.

Therefore, it is considered that the anisotropy of a film substrate using said glass cloth can be reduced by making the cross-sectional shape of the warp yarn and the weft yarn the same and by making the waviness state of each yarn the same, in addition to using the same glass yarn as the warp yarn and the weft yarn forming the glass cloth.

The term "cross-sectional shape" means in this context the width and the thickness of the yarn forming the glass cloth and can be measured by observing, using an electron microscope, the cross-section of said yarn obtained by embedding said yarn in an epoxy resin, followed by a cutting out by machining. When the same glass yarn is used, yarn thickness is reduced by increasing the yarn width by fabrication and the like, and therefore, in regard to anisotropy in the XY directions, yarn width can represent the cross-sectional shape. To reduce the anisotropy of a film substrate using glass cloth, the ratio of warp yarn width to weft yarn width, forming said glass cloth, is not less than 0.80 and not more than 1.20, and preferably is not less than 0.90 and not more than 1.10.

Glass cloth has a woven fabric structure, and therefore it has the characteristic of elongating in one direction in a XY plane under tension. The elongation correlates to the waviness of the yarn. That is, a larger waviness amount provides a higher elongation under tension. It is known that under only one directional tension, the waviness of a yarn in a crossing direction to said direction also has an influence on the elongation under tension in said direction (crimp shift) and thus the waviness of the yarns forming the glass cloth has large effects on the elongation under tension. Therefore, the waviness state of whole glass cloth can be evaluated by the elongation rate in the length direction and the elongation rate in the width direction under tension.

In the present invention, said elongation rate under tension is evaluated by using the method described in JIS R3420, "A general method for glass fiber, item 7.4 Tensile strength". In said JIS specified method, a load at break is determined as follows: A test piece, having a width of 30 mm and a length of about 250 mm, is sampled from a woven fabric in a warp yarn direction and a weft yarn direction and two chucks with a width of 25 mm are set at about 150 mm distance apart to be subjected to an elongation of about 200 mm/min by holding said test piece at the two chuck parts.

In the present invention, however, to improve measurement accuracy in a load range before break, the elongation rate was determined by increasing the rate of the distance between the chuck parts under load (100×(distance under load−distance under no load)/distance under no load), under the same conditions as in the JIS specified method, except that the elongation speed was set to be 10 mm/min and a test piece with width of 35 mm and length of 185 mm was used and the distance between the chucks was set to be 75 mm. FIG. 1 shows the measurement results of the elongation rate in each direction of a conventional glass cloth called 2116 type glass cloth, as an example of the results measured by increasing the load per 25 mm chuck width, from 5 N to 100 N. Because this 2116 type glass cloth has a larger waviness in the weft yarn than the warp yarn to which tension is loaded during weaving, the elongation rate is larger in the width direction than in the length direction.

It was clarified by a study of the present inventors that the use of elongation rate as a waviness state index was not suitable, because a large mesh bend was generated in the glass cloth under load condition per 25 mm of more than 100 N, although break did not occur. It was also clarified that in a low load range, the ratio of the elongation rate in the length direction to the elongation rate in the width direction was not constant. However, in a load per 25 mm in a range from 25 to 100 N, it was nearly constant. Therefore, the elongation rate was determined to be measured under load per 25 mm width of glass cloth in a range from 25 to 100 N. Based on a study by the present inventors, to reduce the anisotropy of a film substrate using glass cloth, the ratio of the elongation rate in the length direction under load in the length direction to the elongation rate in the width direction under load in the width direction, in a load range of from 25 N to 100 N per 25 mm, is preferably not less than 0.80 and not more than 1.20, more preferably not less than 0.90 and not more than 1.10 and further preferably not less than 0.95 and not more than 1.05.

The thickness of a glass cloth, used in a film substrate, is preferably as thin as possible. However, a film thinner than a certain level can not provide the necessary characteristics of strength. Specifically, said thickness is preferably not less than 10 μm and not more than 50 μm, and more preferably not less than 15 μm and not more than 30 μm.

To make the thickness thin, a smaller diameter of filaments of the glass yarn forming the glass cloth is effective, however, too thin filaments may generate a strength problem. Specifically, the average diameter of filaments is preferably not less than 3.0 μm and less than 6.0 μm, and more preferably not less than 3.0 μm and less than 5.0 μm. At the same time, less filaments distribution in the Z direction of a bundle of filaments provides a thinner thickness. To attain this, it is preferable that bundles of filaments are in a sufficiently widened state. Also to reduce filaments distribution in the Z direction and achieve a sufficiently widened state, the number of filaments in a bundle of filaments is preferably fewer, but required to be at least 50 to be a glass yarn. Therefore, for a bundle of filament to be sufficiently widened and to form thin cloth, the number of filaments of glass yarn is preferably not more than 204 and not less than 50 and more preferably not more than 100 and not less than 50.

To be used as glass cloth, a glass cloth structure with less weave distortion and abrasion marks is important. Therefore, it is preferable that yarns forming a glass cloth are aligned so that the distance between adjacent yarns in the same direction is as narrow as possible.

By using such glass cloth, a significantly uniform film substrate with less anisotropy in the XY directions can be obtained. Also by using a sufficiently widened glass yarn, surface roughness in the preparation of a film substrate is significantly improved, resistance on processing is reduced and good performance in not only laser processing but also in drilling processing can be maintained. The term "sufficiently widened glass yarn" in this context, means glass yarn aligned so that the distance between adjacent yarns is as narrow as possible.

To obtain the glass cloth of the present invention, glass yarn with a twist number usually used (0.7 to 10 times/inch) can be used, however, low twisting is preferable so that the twist number of the glass yarn is not more than 0.5 time/inch, more preferably not more than 0.3 to 0 time/inch. By using low twisted yarn, yarn width is more extended and the thickness of the glass cloth can be reduced. Also, glass fiber distribution in the glass cloth can be more uniform because the yarn can be in a flat state and the cross-sectional shape of the yarn itself tends to change from an eclipsed circle shape to a flat plate shape.

Furthermore, it is preferable that by performing such as fiber-opening treatment by water flow pressure, high frequency vibration by a liquid medium or by continuous ultrasonic wave, and roll press, and the like, the yarns forming the glass cloth are subjected to a flattening processing. In a flattening processing, yarn width extends and both the warp yarn and the weft yarn tend to more easily form a structure where adjacent yarns themselves align substantially without clearance. Also, because the yarn flattens and the cross-sectional shape of the yarn itself changes from an eclipsed circle shape to a flat plate shape, uniform glass fiber distribution in the glass cloth can be attained similar to that attained by the above-described low yarn twisting.

When an fiber-opening treatment by water flow pressure is adopted as the flattening processing, spray processing or columnar flow processing is preferable.

The term "spray processing" means in this context, an fiber-opening treatment performed by a high pressure water flow spray injected from a nozzle with a wide spread angle. The nozzle used in spray processing includes, in broad classification, a fan shaped nozzle, an equal fan shaped nozzle, a filled circular cone nozzle and a hollow circular cone nozzle, however, a fan shaped nozzle or an equal fan shaped nozzle is preferable to widening of filaments in a bundle or weave cross points. When a filled circular cone nozzle is used, abrasion marks may be generated in said glass cloth by the high pressure water concentrated at just below the nozzle, because the water amount injected at the glass cloth is significantly different at a section just below the nozzle and the end parts where the water spray spreads. Also when a hollow circular cone nozzle is used, the efficiency of the flattening processing decreases because of a significant decrease in the impact force relative to the water amount injected compared with a fan nozzle.

For spray processing, a nozzle with a spread angle in a range of 10 to 150° is preferable, more preferably a spread angle in a range of 50° to 110°. A nozzle with a spread angle below 10° provides a small degree of widening of the filaments in a bundle or at weave cross points, whereas, a nozzle with a spread angle over 150° provides a significant difference in impact force, when the water flow collides with the glass cloth, between a nozzle center section and the end parts where the water spray spreads, because of a significantly long distance from the nozzle center section to its end parts where the water spray spreads.

It is preferable to align the nozzle used in spray processing in a step-like alignment such as a zigzag alignment, an irregular zigzag alignment and a combination of a zigzag alignment and a specified angle inclined alignment. Also it is preferable to place the nozzle at a specified angle to the width direction of the glass cloth, for example, 5 to 10° inclined from a direction perpendicular to the glass cloth or in parallel to the width direction of the glass cloth. Nozzle alignment pitch may be adjusted, as appropriate, depending on the spread angle of the high pressure water spray flow, the distance from the nozzle to the glass cloth and the degree of overlap of the adjacent high pressure water spray flow.

The term "columnar flow processing" means in this context, a fiber-opening treatment performed by columnar flow high pressure water injected from a nozzle group having pores with a diameter of 0.1 to 0.5 mm. A nozzle type suitably used in columnar flow processing includes many straight line nozzles aligned independently and a plate-like nozzle, however, many nozzles, generally called straight nozzles, with a water flow spread angle of 0° and having independent pores can also be aligned. When these nozzles are aligned in a row, it is difficult for columnar flow high pressure water to be injected uniformly on the whole surface of the glass cloth. Thus it is preferable that the nozzle group is aligned in multiple rows by placing them a little apart in the width direction. Also to prevent localization of the impact force of the injected water on the glass cloth, it is preferable that the nozzle group itself is subjected to fluctuation or a circular motion.

The pressure of the water used in the above-described spray processing or columnar flow processing is preferably 10 $N/cm^2$ to 1000 $N/cm^2$, more preferably 50 $N/cm^2$ to 800 $N/cm^2$ and most preferably 50 $N/cm^2$ to 500 $N/cm^2$. When the water pressure in the flattening processing is below 10 $N/cm^2$, a widening effect at a bundle of filaments of the glass cloth and weave cross points cannot be obtained, while, when it is over 1000 $N/cm^2$, weave mesh of the warp yarn and the weft yarn forming the glass cloth may slip by the widening force.

When a fiber-opening treatment by high frequency vibration using a liquid medium is performed in the flattening processing, it is preferable that such processing is performed by transmitting an ultrasonic wave to the glass cloth via a medium by using an ultrasonic vibrator vibrating at a specified frequency. The medium for the transmission of the ultrasonic wave may be selected, as appropriate, within a range that achieves the effect of a flattening processing and is preferably water, an organic solvent such as an alcohol, and the like, water dispersed with an organic solvent, etc.

The frequency of said ultrasonic vibrator is preferably 10 to 100 kHz, more preferably 15 to 70 kHz and most preferably 20 to 50 kHz. When the frequency is below 10 kHz, the uniformity of the widening state becomes poor, while a frequency over 100 kHz lowers the widening state.

The output of an ultrasonic oscillator for driving said ultrasonic vibrator is 20 to 5000 W, preferably 100 to 1500 W and most preferably 200 to 1000 W. Such equipment includes, for example, an ultrasonic oscillator of "Phoenix series" from Kaijo Co., Ltd.

In a fiber-opening treatment by high frequency vibration using the above-described liquid as the medium, both the glass cloth and the ultrasonic vibrator are soaked in a chamber filled with a liquid and then the ultrasonic wave is generated from the ultrasonic vibrator by said ultrasonic oscillator for the flattening processing. The transmission of the ultrasonic wave to the glass cloth in the fiber-opening treatment is not performed by direct contact between the glass cloth and the ultrasonic vibrator, but via the medium. Therefore, it is preferable that the glass cloth and the ultrasonic vibrator are placed so as not to contact each other. The distance between the glass cloth and the ultrasonic vibrator is preferably in a range of 1 to 30 cm and more preferably in a range of 1 to 10 cm. When the distance between the glass cloth and the ultrasonic vibrator is less than 1 cm, the glass cloth may be locally deformed in processing, resulting in a poor appearance. While, when said distance is more than 30 cm, the loss of energy of the ultrasonic vibrator transmitted to the glass cloth increases. The distance between the glass cloth and the ultrasonic vibrator is preferably determined by consideration of conditions such as the kind of glass cloth, the kind of liquid, the frequency of the ultrasonic vibrator, the output of the ultrasonic oscillator, the transmission direction of the ultrasonic wave, etc. The number of the ultrasonic vibrator may be one or many, as long as the distance between the glass cloth and the ultrasonic vibrator can be set nearly constant.

A fiber-opening treatment by high frequency vibration using the above-described liquid as the medium may be performed by any of a continuous system or a batch system. When a continuous system is adopted, for example, such a method is used, wherein an ultrasonic vibrator is fixed in a chamber filled with a liquid and the glass cloth is passed through the chamber. The running speed of the glass cloth may be set, as appropriate, within a range that the processing effect of the present invention can be achieved. However, 0.1 to 100 m/min is preferable.

The placement of the ultrasonic vibrator and the glass cloth is generally set so that the angle between the width direction of the vibrator and the running direction of the glass cloth is 90°. However, a placement to provide several tens degree may be allowed.

The time required in the fiber-opening treatment by soaking the glass cloth in the liquid may be set, as appropriate, within a range to achieve the effect of the present invention. However, about 0.01 to 30 seconds is preferable.

In this case, when the above-described flattening processing is performed under tension for conveying the warp yarn forming the glass cloth, the flattening of the warp yarn is more difficult than the weft yarn. Therefore, in the step for performing the above-described flattening processing, it is preferable that the tension exerted on the glass cloth for conveying is not more than 49 N/m (5 kg/m) per 1 m width of glass cloth and more preferably not more than 20 N/m (2 kg/m).

The tension exerted on the glass cloth in the flattening processing is preferably measured by a tension detection method using a tension detector generally used in the film field. In said tension detection method, two guide rolls (hereinafter called guide roll 1 and guide roll 2) and one tension detecting roll are placed at the peaks of an isosceles triangle so as to be in left-right symmetry, and they are set so that the glass cloth passes in the order of the guide roll 1, the tension detecting roll and the guide roll 2. In the tension detecting roll, a resultant force of tension exerted to the guide roll 1, tension to the guide roll 2 and gravity to said tension detecting roll acts as a load downward to said tension detecting roll. Therefore, from a measured value by a load sensor set under said tension detecting roll, the tension exerted on glass cloth can be calculated.

As a method for applying tension to the warp yarn of a glass cloth, in an appropriately set range, in a flattening processing, such a method using control equipment can preferably be used, for controlling the rotation speed of a drive roll, placed before and after the flattening processing unit, to convey glass cloth, by a continuous monitoring of the tension in the warp yarn direction by the above-described tension detector. Said tension control equipment decreases the rotation speed of a forward drive roll in a proceeding direction and increases the speed of a rear drive roll, when the tension detected by the tension detector is more than the set value, while, when the tension detected by the tension detector is lower than the set value, the rotation speed of the forward drive roll in the proceeding direction is increased and the speed of the rear drive roll is decreased. By this, the tension exerted on the warp yarn direction can be controlled. When a flattening processing under further lower tension is required, for example, a horizontal conveyor unit as disclosed in JP-A-11-507995, can preferably be used instead of a usually used roll winding type conveyor unit.

In the above-described JP-A-2002-38367, there is a description of a fiber-opening treatment under low tension. However, it only provides a ratio of warp yarn width to weft yarn width of 0.59 to 0.67, calculated from the opening ratio of warp yarn to weft yarn (opening ratio=yarn width×100/(25/density)) described in the Examples. This value is insufficient to eliminate anisotropy in the XY directions, which is the object of the present invention.

Contrary to this, by performing a flattening processing under tension exerted on the glass cloth for conveying within the above-described range as in the present invention, glass cloth with a ratio of average width of warp yarn to average width of weft yarn is not less than 0.80 and not more than 1.20 can be obtained. In JP-A-2002-38367, there is no description of a specific tension value. Therefore, the generation of a reason for such a difference is not clear. However, in the invention of JP-A-2002-38367, a roll type fiber-opening equipment is used and thus it is estimated that a practical tension exerted on the glass cloth could not be reduced so much compared with the above-described horizontal conveyor roll. Also it is estimated that because the fiber-opening treatment is performed by a water flow coming in and out from pores set at said roll, the degree of fiber-opening treatment is weak in the area not contacted with a pore in the whole surface of the glass cloth.

It is preferable to perform the flattening processing of the glass cloth in an adhered state of organic substances, showing characteristics of lubricants, to glass yarns, or in an adhered state of binders, sizing agents, and the like usually used in weaving usual glass cloth (usually called gray fabric), or a flattening processing by a combination of these methods, because they provide a better effect of reducing anisotropy in the XY directions of the glass cloth compared with a simple flattening processing. A combination of a low twist processing and a flattening processing is further effective to reduce anisotropy in the XY directions.

The glass cloth after the flattening processing is subjected to drying by an infrared heater, a hot air dryer, etc. Drying conditions are preferably set at 100 to 200° C. for about 10 seconds to 2 minutes. When the tension exerted on the yarn during drying is high, the glass yarn, even if sufficiently widened by the above-described flattening processing, may return to its original state due to the tension. Therefore, it is preferable to perform the drying under a tension condition similar to that used in the flattening processing.

In roll winding of glass cloth after drying, the tension exerted on one warp yarn in the warp yarn direction is preferably within a range of $1.5 \times 10^{-4}$ to $6.0 \times 10^{-3}$ N, more preferably within a range of $6.0 \times 10^{-4}$ to $4.5 \times 10^{-3}$ N and most preferably within a range of $1.5 \times 10^{-3}$ to $3.0 \times 10^{-3}$ N. When the glass cloth is wound under a tension lower than $1.5 \times 10^{-4}$ N, it is difficult to prevent winding collapse. While, when the glass cloth is wound under tension of more than $6.0 \times 10^{-3}$ N, the glass yarn, even if sufficiently widened by the above-described flattening processing, may return to its original state due to the tension.

Glass cloth wound on a roll is subjected to a process for removing binders, sizing agents, and the like coated on the surface, by high temperature desizing. After that, to enhance adhesive strength with a matrix resin to be impregnated, it is preferable to coat the glass cloth with a silane coupling agent and dry it. Further, handling of the glass cloth is improved by performing a processing to increase the hard feeling of the glass cloth as a surface treatment usually performed on glass cloth. For example, using a processing agent with a high coatability to increase attached amount, increasing the degree of polycondensation of silanol groups of a silane coupling agent generally used as a treatment agent or performing a processing with a mesh fastening effect of a glass yarn, etc.

By impregnation of a matrix resin in the above-described sheet of glass cloth of the present invention, in accordance with a known method, the film substrate of the present invention with a small anisotropy in the XY directions can be obtained. The matrix resin used includes thermosetting resins such as an epoxy resin, an unsaturated polyester resin, a polyimide resin, a bismaleimide triazine resin, a cyanate resin, and the like; thermoplastic resins such as a polyphenylene oxide resin, a polyetherimide resin, a fluorocarbon resin, and the like; or mixed resins thereof; etc. A resin mixed with an inorganic filler such as aluminum hydroxide, talc, and the like may also be used. However, the matrix resin is preferably a resin with superior flexibility, in view of the object of the present invention.

The present invention is explained in more detail by Examples.

The properties of the glass cloth in the Examples and Comparative Examples were measured by the following test methods and a preparation method of a laminated plated using the glass cloth is as follows.

1. A Measurement Method for the Physical Property of the Glass Cloth

The property was measured in accordance with JIS R3420. The elongation rate under load was measured by application of JIS R3420 as described before.

2. A Measurement Method for Warp Yarn Width and Weft Yarn Width of the Glass Cloth The glass cloth was embedded in an epoxy resin of normal temperature cure type, followed by polishing and cutting out of a glass yarn cross-section to be subjected to photographing of the cross-section of each warp yarn and each weft yarn with an electron microscope (S-570 from Hitachi Ltd.) in 220 times measurement magnification. The yarn width was measured on each of 150 warp yarns and weft yarns to calculate the average width for the warp yarn and the weft yarn.

3. Molding Conditions of a Film Substrate

As a matrix resin, an epoxy resin varnish was prepared by compounding 85 parts by weight (solids) of a brominated bisphenol A type epoxy resin 5046 (from Japan Epoxy Resin Co., Ltd.), 15 parts by weight (solids) of a cresol-Novolac type epoxy resin 180 (from Japan Epoxy Resin Co., Ltd.), 12 parts by weight of N,N-dimethylformamide, 12 parts by weight of methoxyethanol, 2.5 parts by weight of dicyandiamide and 0.2 part by weight of 2-ethyl-4-methylimidazole. Into said epoxy resin varnish, glass cloth was soaked, followed by raking off excessive varnish through a slit, drying in an oven at 125° C. for 10 minutes, and semi-hardening said epoxy resin (B-stage) to obtain a prepreg.

At both surfaces of this prepreg, 12 µm thick copper foil was plastered and compression molded at 175° C. under 40 kgf/cm$^2$ to obtain a film substrate.

4. A Measurement Method for the Dimensional Change Rate (%) of a Film Substrate

Dimensional change rate was measured in accordance with JIS K6911. Specifically it was measured as follows. On the film substrate obtained by the method in the above section 3, a total of nine (9) gauge marks, that is, three (3) marks each in the length and width directions, were set at 125 mm distance, and six (6) adjacent distances in each length direction and width direction were measured (measured value "a"). Then the copper foil was removed by an etching treatment, followed by heating at 170° C. for 30 minutes to re-measure said inter-mark distances (measured value "b"). The ratio of the difference between measured value "a" and measured value "b" to measured value "a" was calculated for the length direction and the width direction and an average value of 6 values was used as the dimensional change rate (%) for the length direction and the width direction.

5. Warpage Amount

Warpage amount was measured in accordance with JIS K6911.

EXAMPLE 1

Using glass yarn having an E glass composition with an average filament diameter of 4.1 µm, a number of filaments of 100 and a twist number of 1.0Z as the warp yarn and the weft yarn, a glass cloth having a weave density of 75 warp yarns per inch and 75 weft yarns per inch was woven using air jet looming, followed by subjecting the thus obtained gray fabric to a fiber-opening treatment (pressure of 196 N/cm$^2$ (20 kgf/cm$^2$)) by high pressure water spraying flow under a tension of 4.9 N/m (0.5 kgf/m). Then it was subjected to a high temperature desizing at about 400° C. for 24 hours, followed by soaking the glass cloth in a treatment solution using, as the surface treatment, a silane coupling agent "SZ6032" (from Toray Dow Corning Co., Ltd.), squeezing the solution and drying at 120° C. for 1 minute to obtain glass cloth having a weight of 19 g/m$^2$, a thickness of 0.016 mm, and a ratio of warp yarn width to weft yarn width (hereinafter named warp yarn width/weft yarn width) of 0.93.

From said glass cloth, a test piece in the weft yarn direction was sampled and an elongation rate in the weft yarn direction was measured when each load of 25, 50 and 100 (N/25 mm) was added in the weft yarn direction. Similarly, by sampling a test piece in the warp yarn direction, an elongation rate in the warp yarn direction was measured when each load of 25, 50 and 100 (N/25 mm) was added in the warp yarn direction. Calculated values of the ratio of the elongation rate in the length direction to the elongation rate in the width direction under each load of 25, 50 and 100 (N/25 mm) were 0.91, 0.90 and 0.85, respectively. A film substrate was molded using said glass cloth, whose evaluation results are shown in Table 1.

EXAMPLE 2

Using glass yarn having an E glass composition with an average filament diameter of 4.5 µm, a number of filaments of 100 and a twist number of 1.0Z as the warp yarn and the weft yarn, a glass cloth having a weave density of 70 warp yarns per inch and 73 weft yarns per inch was woven using air jet looming, followed by subjecting the thus obtained gray fabric to a fiber-opening treatment (pressure of 196 N/cm$^2$ (20 kgf/cm$^2$)) by high pressure water spraying flow under a tension of 4.9 N/m (0.5 kgf/m). Then it was subjected to a high temperature desizing at about 400° C. for 24 hours, followed by soaking the glass cloth in a treatment solution using, as the surface treatment, a silane coupling agent "SZ6032" (from Toray Dow Corning Co., Ltd.), squeezing the solution and drying at 120° C. for 1 minute to obtain a glass cloth having a weight of 23 g/m$^2$, a thickness of 0.025 mm, and a warp yarn width/weft yarn width=0.95.

From said glass cloth, a test piece was sampled, and calculated, similarly as in Example 1. The values of the ratio of the elongation rate in the length direction to the elongation rate in the width direction under each load of 25, 50 and 100 (N/25 mm) were 0.97, 0.95 and 0.91, respectively. A film substrate was molded using said glass cloth, whose evaluation results are shown in Table 1.

EXAMPLE 3

Using glass yarn having an E glass composition with an average filament diameter of 5.0 µm, a number of filaments of 70 and a twist number of 1.0Z as the warp yarn and the weft yarn, a glass cloth having a weave density of 80 warp yarns per inch and 70 weft yarns per inch was woven using air jet looming, followed by subjecting the thus obtained gray fabric to a fiber-opening treatment (pressure of 196 N/cm$^2$ (20 kgf/cm$^2$)) by high pressure water spraying flow under a tension of 4.9 N/m (0.5 kgf/m). Then it was subjected to a high temperature desizing at about 400° C. for 24 hours, followed by soaking the glass cloth in a treatment solution using, as the surface treatment, a silane coupling agent "SZ6032" (from Toray Dow Corning Co., Ltd.), squeezing the solution and drying at 120° C. for 1 minute to obtain a glass cloth having a weight of 23 g/m$^2$, a thickness of 0.029 mm, and a warp yarn width/weft yarn width=0.95.

From said glass cloth, a test piece was sampled, and calculated, similarly as in Example 1. The values of the ratio of the elongation rate in the length direction to the elongation rate in the width direction under each load of 25, 50 and 100 (N/25 mm) were 1.00, 1.00 and 0.95, respectively. A film substrate was molded using said glass cloth, whose evaluation results are shown in Table 1.

EXAMPLE 4

Using glass yarn having an E glass composition with an average filament diameter of 4.1 μm, a number of filaments of 100 and a twist number of 0.3Z as the warp yarn and the weft yarn, a glass cloth having a weave density of 75 warp yarns per inch and 75 weft yarns per inch was woven using air jet looming, followed by subjecting the thus obtained gray fabric to a fiber-opening treatment (pressure of 196 N/cm$^2$ (20 kgf/cm$^2$)) by high pressure water spraying flow under a tension of 4.9 N/m (0.5 kgf/m). Then it was subjected to high temperature desizing at about 400° C. for 24 hours, followed by soaking the glass cloth in a treatment solution using, as the surface treatment, a silane coupling agent "SZ6032" (from Toray Dow Corning Co., Ltd.), squeezing the solution and drying at 120° C. for 1 minute to obtain a glass cloth having a weight of 19 g/m$^2$, a thickness of 0.016 mm, and a warp yarn width/weft yarn width=0.98.

From said glass cloth, a test piece was sampled, and calculated, similarly as in Example 1. The values of the ratio of the elongation rate in the length direction to the elongation rate in the width direction under each load of 25, 50 and 100 (N/25 mm) were 0.96, 0.95 and 0.91, respectively. A film substrate was molded using said glass cloth, whose evaluation results are shown in Table 1.

EXAMPLE 5

Using glass yarn having an E glass composition with an average filament diameter of 4.5 μm, a number of filaments of 100 and a twist number of 0.3Z as the warp yarn and the weft yarn, a glass cloth having a weave density of 70 warp yarns per inch and 73 weft yarns per inch was woven using air jet looming, followed by subjecting the thus obtained gray fabric to a fiber-opening treatment (pressure of 196 N/cm$^2$ (20 kgf/cm$^2$)) by high pressure water spraying flow under a tension of 4.9 N/m (0.5 kgf/m). Then it was subjected to high temperature desizing at about 400° C. for 24 hours, followed by soaking the glass cloth in a treatment solution using, as the surface treatment, a silane coupling agent "SZ6032" (from Toray Dow Corning Co., Ltd.), squeezing the solution and drying at 12.0° C. for 1 minute to obtain a glass cloth having a weight of 23 g/m$^2$, a thickness of 0.025 mm, and a warp yarn width/weft yarn width=0.98.

From said glass cloth, a test piece was sampled, and calculated, similarly as in Example 1. The values of the ratio of the elongation rate in the length direction to the elongation rate in the width direction under each load of 25, 50 and 100 (N/25 mm) were 1.00, 1.00 and 0.94, respectively. A film substrate was molded using said glass cloth, whose evaluation results are shown in Table 1.

COMPARATIVE EXAMPLE 1

Using glass yarn having an E glass composition with an average filament diameter of 5.0 μm, a number of filaments of 100 and a twist number of 1.0Z as the warp yarn and the weft yarn, a glass cloth having a weave density of 56 warp yarns per inch and 56 weft yarns per inch was woven using air jet looming, followed by high temperature desizing at about 400° C. for 24 hours and soaking the glass cloth in a treatment solution using, as the surface treatment, a silane coupling agent "SZ6032" (from Toray Dow Corning Co., Ltd.), squeezing the solution and drying at 120° C. for 1 minute to obtain a glass cloth having a weight of 25 g/m$^2$, a thickness of 0.040 mm, and a warp yarn width/weft yarn width=0.75.

From said glass cloth, a test piece was sampled, and calculated, similarly as in Example 1. The values of the ratio of the elongation rate in the length direction to the elongation rate in the width direction under each load of 25, 50 and 100 (N/25 mm) were 0.78, 0.65 and 0.60, respectively. A film substrate was molded using said glass cloth, whose evaluation results are shown in Table 1.

COMPARATIVE EXAMPLE 2

Using glass yarn having an E glass composition with an average filament diameter of 4.5 μm, a number of filaments of 100 and a twist number of 1.0Z as the warp yarn and the weft yarn, a glass cloth having a weave density of 70 warp yarns per inch and 73 weft yarns per inch was woven using air jet looming, followed by high temperature desizing at about 400° C. for 24 hours and soaking the glass cloth in a treatment solution using, as the surface treatment, a silane coupling agent "SZ6032" (from Toray Dow Corning Co., Ltd.), squeezing the solution and drying at 120° C. for 1 minute to obtain a glass cloth having a weight of 23 g/m$^2$, a thickness of 0.033 mm, and a warp yarn width/weft yarn width=0.60.

From said glass cloth, a test piece was sampled, and calculated, similarly as in Example 1. The values of the ratio of the elongation rate in the length direction to the elongation rate in the width direction under each load of 25, 50 and 100 (N/25 mm) were 0.78, 0.70 and 0.60, respectively. A film substrate was molded using said glass cloth, whose evaluation results are shown in Table 1.

COMPARATIVE EXAMPLE 3

Using glass yarn having an E glass composition with an average filament diameter of 4.5 μm, a number of filaments of 100 and a twist number of 1.0Z as the warp yarn and the weft yarn, a glass cloth having a weave density of 70 warp yarns per inch and 73 weft yarns per inch was woven using air jet looming, followed by subjecting the thus obtained gray fabric to a fiber-opening treatment (pressure of 196 N/cm$^2$ (20 kgf/cm$^2$)) by high pressure water spraying flow under tension of 294 N/m (30 kgf/m). Then it was subjected to a high temperature desizing at about 400° C. for 24 hours, followed by soaking the glass cloth in a treatment solution using, as the surface treatment, a silane coupling agent "SZ6032" (from Toray Dow Corning Co., Ltd.), squeezing the solution and drying at 120° C. for 1 minute to obtain a glass cloth having a weight of 23 g/m$^2$, a thickness of 0.027 mm, and a warp yarn width/weft yarn width=0.50.

From said glass cloth, a test piece was sampled, and calculated, similarly as in Example 1. The values of the ratio of the elongation rate in the length direction to the elongation rate in the width direction under each load of 25, 50 and 100 (N/25 mm) were 0.65, 0.60 and 0.53, respectively. A film substrate was molded using said glass cloth, whose evaluation results are shown in Table 1.

INDUSTRIAL APPLICABILITY

In accordance with the present invention, a glass cloth superior in isotropic nature, along with mechanical characteristics such as dimensional stability, and the like used in a printed circuit board and a film substrate using said glass cloth can be provided.

TABLE 1

| | Dimensional change rate (%) | | Warpage |
|---|---|---|---|
| | Length direc. | Width direc. | mm |
| Example 1 | −0.03 | −0.03 | 3 |
| Example 2 | −0.03 | −0.03 | 3 |
| Example 3 | −0.01 | −0.01 | 1 |
| Example 4 | −0.02 | −0.02 | 2 |
| Example 5 | −0.02 | −0.02 | 2 |
| Comp. Expl. 1 | −0.10 | −0.06 | 9 |
| Comp. Expl. 2 | −0.05 | −0.04 | 6 |
| Comp. Expl. 3 | −0.06 | −0.03 | 7 |

The invention claimed is:

1. A process for manufacturing a glass cloth comprising the steps of weaving a glass cloth composed of a warp yarn and a weft yarn of the same glass yarn and flattening the glass cloth under a tension exerted on the glass cloth of not more than 49 N/m per 1 m width of the glass cloth, wherein a thickness of the glass cloth is not less than 10 μm and not more than 30 μm, a ratio of warp yarn width to weft yarn width is not less than 0.80 and not more than 1.20 and a ratio of an elongation rate in a length direction when a load in a range of 25 N to 100 N per 25 mm width of the glass cloth is added in a warp yarn direction, to an elongation rate in a width direction when said load is added in a weft yarn direction is not less than 0.80 and not more than 1.20.

2. The process for manufacturing the glass cloth according to claim 1, further comprising the step of drying the glass cloth under a tension exerted on the glass cloth of not more than 49 N/m per 1 m width of the glass cloth.

3. The process for manufacturing the glass cloth according to claim 1 or 2, wherein the glass cloth is woven by using an air jet loom.

* * * * *